(12) United States Patent
Amro et al.

(10) Patent No.: US 8,214,916 B2
(45) Date of Patent: Jul. 3, 2012

(54) LARGE AREA, HOMOGENEOUS ARRAY FABRICATION INCLUDING LEVELING WITH USE OF BRIGHT SPOTS

(75) Inventors: Nabil A. Amro, Wheeling, IL (US); Raymond Sanedrin, Skokie, IL (US)

(73) Assignee: NanoInk, Inc., Skokie, IL (US)

( * ) Notice: Subject to any disclaimer, the term of this patent is extended or adjusted under 35 U.S.C. 154(b) by 0 days.

(21) Appl. No.: 12/656,312

(22) Filed: Jan. 25, 2010

(65) Prior Publication Data

US 2010/0251439 A1    Sep. 30, 2010

Related U.S. Application Data

(60) Provisional application No. 61/147,449, filed on Jan. 26, 2009.

(51) Int. Cl.
G01Q 20/02    (2010.01)
(52) U.S. Cl. .................... 850/6; 850/40; 850/32
(58) Field of Classification Search ............... 850/40
See application file for complete search history.

(56) References Cited

U.S. PATENT DOCUMENTS

| | | | | |
|---|---|---|---|---|
| 5,141,319 A * | 8/1992 | Kajimura et al. | ............. | 356/486 |
| 5,171,992 A | 12/1992 | Clabes et al. | | |
| 5,260,926 A * | 11/1993 | Kuroda et al. | ............. | 369/100 |
| 5,517,027 A * | 5/1996 | Nakagawa et al. | ............. | 850/1 |
| 5,939,709 A * | 8/1999 | Ghislain et al. | ............. | 250/216 |
| 6,441,359 B1 * | 8/2002 | Cozier et al. | ............. | 250/216 |
| 6,559,926 B2 * | 5/2003 | Yamaguchi et al. | ............. | 355/53 |
| 6,635,311 B1 | 10/2003 | Mirkin et al. | | |
| 6,768,095 B2 * | 7/2004 | Niwa et al. | ............. | 250/216 |
| 6,827,979 B2 | 12/2004 | Mirkin et al. | | |
| 6,867,443 B2 | 3/2005 | Liu et al. | | |
| 7,034,854 B2 | 4/2006 | Cruchon-Dupeyrat et al. | | |
| 7,060,977 B1 | 6/2006 | Dupeyrat et al. | | |
| 7,238,294 B2 | 7/2007 | Koops et al. | | |
| 7,279,046 B2 | 10/2007 | Eby et al. | | |
| 7,291,284 B2 | 11/2007 | Mirkin et al. | | |
| 7,344,756 B2 | 3/2008 | Mirkin et al. | | |
| 7,404,314 B2 * | 7/2008 | Sahin et al. | ............. | 73/105 |
| 2002/0000511 A1 | 1/2002 | Schaffer et al. | | |
| 2003/0233870 A1 * | 12/2003 | Mancevski | ............. | 73/105 |
| 2005/0235869 A1 * | 10/2005 | Cruchon-Dupeyrat et al. | ............. | 106/31.29 |

(Continued)

FOREIGN PATENT DOCUMENTS

WO    WO 2005/115630 A2    12/2005

(Continued)

OTHER PUBLICATIONS

International Search Report and Written Opinion mailed Apr. 20, 2010 in corresponding Application No. PCT/US2010/022014.

(Continued)

*Primary Examiner* — Jack Berman
*Assistant Examiner* — Jason McCormack
(74) *Attorney, Agent, or Firm* — Foley & Lardner LLP

(57) ABSTRACT

Better leveling procedures for patterning at the small scale including the nanoscale. A method comprising: providing at least one array of cantilevers comprising tips thereon, wherein the cantilevers comprise at least one relatively bright spot, or at least two relatively bright spots, near the tip upon viewing, providing a substrate, leveling the array and the substrate with respect to each other, wherein the relatively bright spot near the tip is viewed to determine a contact of the tip and substrate.

24 Claims, 11 Drawing Sheets
(11 of 11 Drawing Sheet(s) Filed in Color)

U.S. PATENT DOCUMENTS

| | | | |
|---|---|---|---|
| 2006/0076488 A1 | 4/2006 | Ina | |
| 2008/0055598 A1 | 3/2008 | Haaheim | |
| 2008/0105042 A1 | 5/2008 | Mirkin et al. | |
| 2008/0266575 A1* | 10/2008 | Gaitas et al. | 356/600 |
| 2008/0309688 A1* | 12/2008 | Haaheim et al. | 346/140.1 |
| 2009/0023607 A1 | 1/2009 | Rozhok et al. | |
| 2009/0133169 A1 | 5/2009 | Mirkin et al. | |
| 2010/0028999 A1* | 2/2010 | Nain | 435/377 |
| 2010/0141939 A1* | 6/2010 | Zhan | 356/301 |
| 2010/0221505 A1 | 9/2010 | Amro et al. | |
| 2010/0227063 A1 | 9/2010 | Amro et al. | |
| 2010/0229264 A1 | 9/2010 | Amro et al. | |

FOREIGN PATENT DOCUMENTS

| | | | |
|---|---|---|---|
| WO | WO 2008/112713 A1 | | 9/2008 |
| WO | WO 2008111433 A1 * | | 9/2008 |
| WO | WO 2009/099619 A2 | | 8/2009 |
| WO | WO 2009/132321 A1 | | 10/2009 |
| WO | WO 2010/007524 A2 | | 1/2010 |

OTHER PUBLICATIONS

Arnold, M. et al., "Activation of Integrin Function by Nanopatterned Adhesive Interfaces," Communications, ChemPhysChem, vol. 5, 2004, pp. 383-388.

Cell Biology, $2^{nd}$ Edition, Pollard & Earnshaw, 2008.

Chung, C. et al., "Differential Behavior of Auricular and Articular Chondrocytes in Hyaluronic Acid Hydrogels," Tissue Engineering: Part A, vol. 14, No. 7, 2008, pp. 1121-1131.

Essentials of Stem Cell Biology, ed. R. Lanza et al., 2006.

Ferreira, L. et al., "New Opportunities: The Use of Nantechnologies to Manipulate and Track Stem Cells," Cell Stem Cell Review, vol. 3, Aug. 7, 2008, pp. 136-146.

Fundamentals of Microfabrication, The Science of Miniaturization, $2^{nd}$ Edition, Madou, 2002, pp. 484-494.

Ginger, D. et al., "The Evolution of Dip-Pen Nanolithography," Angewandte Chemie, vol. 43, 2004, pp. 30-45.

Haaheim, J. et al., "Dip Pen Nanolithography®: A "Desktop Nanfab™" Approach Using High-Throughput Flexible Nanpatterning," Scanning, vol. 30, 2008, pp. 137-150.

Kong, H. et al., "FRET measurements of cell-traction forces and nano-scale clustering of adhesion ligands varied by substrate stiffness," PNAS, vol. 102, No. 12, Mar. 22, 2005, pp. 4300-4305.

Lee, K. et al., "Nanoscale Adhesion Ligand Organization Regulates Osteoblast Proliferation and Differentiation," NANO Letters, vol. 4, No. 8, 2004, pp. 1501-1506.

Principles of Tissue Engineering, $2^{nd}$ Edition, Lanza et al., 2000.

Saha, K. et al., "Designing synthetic materials to control stem cell phonotype," Science Direct, Current Opinion in Chemical Biology, vol. 11, 2007, pp. 381-387.

Salaita, K. et al., "Applications of dip-pen nanolithography," Nature Nanotechnology, vol. 2, Mar. 2007, pp. 145-155.

Yim, E. et al., "Nanapattern-induced changes in morphology and motility of smooth muscle cells," Biomaterials, vol. 26, 2005, pp. 5405-5413.

* cited by examiner

DAPI
Nucleostemin
Actin
STRO-1

LARGE AREA, HOMOGENEOUS ARRAY FABRICATION INCLUDING LEVELING WITH USE OF BRIGHT SPOTS

RELATED APPLICATIONS

This application claims priority to U.S. provisional application Ser. No. 61/147,449 filed Jan. 26, 2009, which is hereby incorporated by reference in its entirety.

BACKGROUND

A need exists for improvements in existing procedures and devices to fabricate large areas of structures, including microstructures and nanostructures. For example, one important area of technology is the ability to transfer materials from a tip, or an array of tips, to a substrate. For example, dots and lines can be formed by this method, which is a direct write patterning or lithography method. Nanoscale tips can be used to form nanoscale structures. One application for such structures includes better engineering of cells including, for example, stem cells.

SUMMARY

Embodiments described herein include, for example, articles, devices, instruments, software, methods of making, and methods of using.

Another embodiment provides a method comprising: providing at least one array of cantilevers comprising tips thereon, wherein the cantilevers comprise at least one relatively bright spot near the tip upon viewing, providing a substrate, leveling the array and the substrate with respect to each other, wherein the relatively bright spot near the tip is viewed to determine a contact of the tip and substrate.

Another embodiment provides a method comprising: providing at least one array of cantilevers comprising tips thereon, wherein the cantilevers comprise at least two relatively bright spots near the tip upon viewing through a viewport in the array, providing a substrate, moving the array and/or the substrate closer with respect to each other, wherein the relatively bright spots near the tip are viewed to determine a contact of the tip and substrate.

Another embodiment provides a method comprising: providing at least one array of cantilevers comprising tips thereon, wherein the cantilevers comprise at least one marker near the tip upon viewing through a viewport in the array, providing a substrate, moving the array and/or the substrate closer with respect to each other, wherein the brightness of the marker near the tip is viewed to determine a contact of the tip and substrate.

An application can be in the field of cell growth including stem cell growth. However, other applications can be also found including electronics and photonics.

At least one advantage can be found in one or more embodiments. For example, in one embodiment, an improvement can be based on leveling a two-dimensional pen array (2D nano PrintArray™) with respect to a substrate surface. If the 2D pen array is not properly leveled with respect to the substrate surface, some pen tips may touch the surface before other tips, some pen tips may not touch the substrate surface at all, and/or the load exerted by these tips onto the substrate surface can be different leading to non-homogeneous and inconsistent patterning. An advantage of at least one improvement can be to determine with certainty when all the tips of the 2D pen array slightly touch the surface with approximately the same exerted force. One or more advantages can be achieved in improving the results of cellular studies and commercialization, including stem cell studies and commercialization, including differentiation studies and commercialization. Other advantages are noted below.

BRIEF DESCRIPTION OF FIGURES

The patent or application file contains at least one drawing executed in color. Copies of this patent or patent application publication with color drawing(s) will be provided by the office upon request and payment of the necessary fee.

FIG. 23—1×1 mm section of ODT substrate stained with DAPI (blue), nucleostamin (green), actin (red) and STRO-1 (purple).

DETAILED DESCRIPTION

Introduction

All references cited herein are hereby incorporated by reference in their entireties.

Priority U.S. provisional application Ser. No. 61/147,449 filed Jan. 26, 2009 is hereby incorporated by reference in its entirety. In addition, U.S. provisional application Ser. No. 61/147,448 filed Jan. 26, 2009 is hereby incorporated by reference in its entirety. U.S. provisional application Ser. No. 61/147,451 filed Jan. 26, 2009 is hereby incorporated by reference in its entirety. U.S. provisional application Ser. No. 61/147,452 filed Jan. 26, 2009 is hereby incorporated by reference in its entirety.

Embodiments described herein including, for example, embodiments for leveling and substrate temperature control can be used for both fabrication, imaging, and other applications.

One preferred embodiment is use of these methods and articles to improve control over processes in which a material is transferred from a tip, or an array of tips, to a substrate. One preferred embodiment is use with high density arrays of nanoscopic tips. Another preferred embodiment is use of the fabricated arrays for cellular studies and commercial use including stem cell studies and commercial use.

In one embodiment, the production of $cm^2$ areas of templated gold surfaces for stem cell differentiation using the Dip Pen Nanolithography® (DPN®) process poses several challenges including, for example, coating pen tips with ink, nonspecific deposition, and leveling the 2D pen array with respect to the substrate surface. If leveling of the 2D pen array is not done properly, pattern deformation, nonhomogeneous structures within the array and between arrays, skewing, and negative features can occur. In addition to these issues, the fabricated structures, in some cases, need to be smaller than 100 nm to initiate stem cell differentiation. Finally, a reliable commercial procedure for the fabrication of homogeneous large substrates, patterned from edge-to-edge, is needed. To overcome these issues, a better understanding is needed for the 2D patterning process and especially the 2D leveling in conjunction with vapor-coating of pen tips in order to produce consistent and homogeneous patterns.

In one application, these aspects can affect directly the differentiation of the stem cells, wherein homogenous patterning can lead to better differentiation.

For leveling the array with respect to the substrate, one can follow the previously established procedure using, for example, leveling software developed recently by NanoInk. See U.S. Provisional Patent Application No. 61/026,196 filed Feb. 5, 2008 (also, WO 2009/099619, published Aug. 13, 2009). There can be a need for human intervention and judgment during this process, and it can in some cases be difficult to judge when the tips are touching the surface and by which loads, which can lead to technical challenges including, for example, non-homogeneous patterning.

Figure 1:
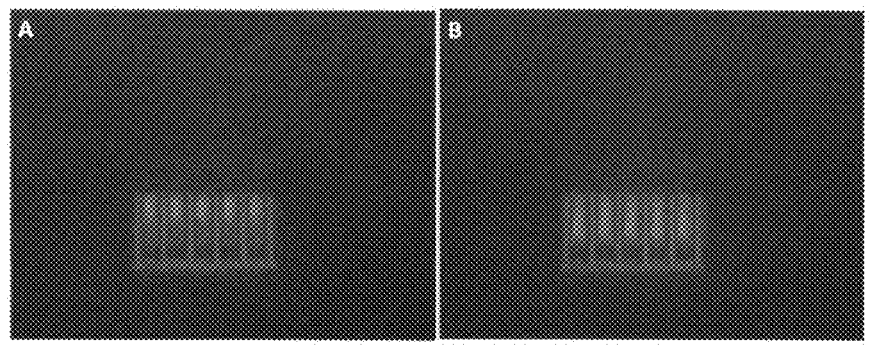
FIG. 1: 2D PenArray approach using cantilever back reflection.

To test the procedure, a 2D pen array can be vapor-coated with octadecanethiol (ODT). The leveling is performed using an optical system to determine if the cantilevers are leveled or not by monitoring the reflection from the back of the cantilever. The procedure depends on how far or how much the tips are pressed onto the surface, which causes the reflection of light from the back of the cantilever to change as shown in FIGS. 1 A and B. This image shows two different reflections on the back of the cantilever as an orange to reddish color.

In this example, the change is evident even though it is not known what the exerted load is; in some instances it is very difficult to know when these tips touch the surface because the change in the reflection from the back of the cantilever is not so obvious. It also, in some cases, can be difficult to repeat the same procedure using different systems and reach the same results. The change of the deflection can be sharp but may not be very sensitive; there is not a cut-off point or a sharp transition between two reflections when the Z-piezoelectric sensors are actuated by 100 nm or a few microns.

Figure 2:
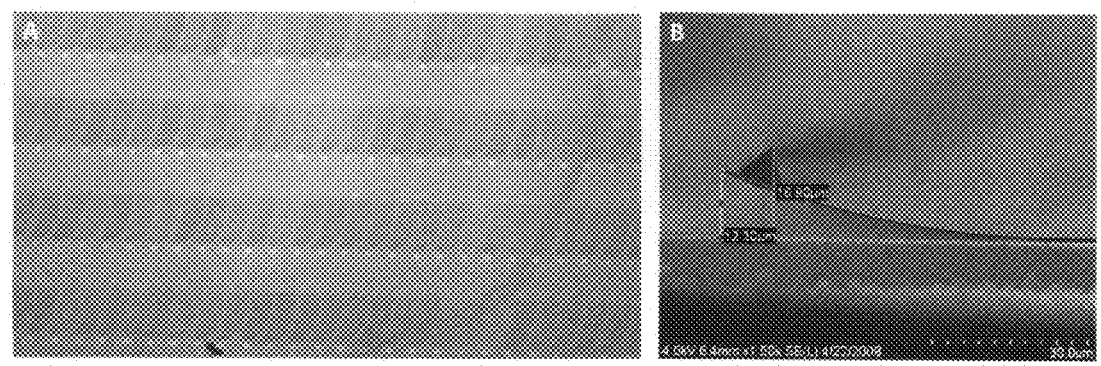
FIG. 2: Fabricated arrays using 2D PenArray when driving the tip into the surface beyond the first initial tip-surface contact point. (A) Optical image skewed rectangular arrays. (B) SEM image of a single tip of a 2D PenArray.

A problem in exerting higher force can be the skewing effect as shown in FIG. 2 A, the bright dots are the approach dots of the first tip-surface contact (contact point "a"), the designed and executed pattern, which is a rectangular dot array (18×40 $\mu m^2$), comprises dots 1 µm in diameter and separated by 4 µm. In this optical image, the arrays are skewed for the first half and will start to adjust for the second half due to decrease of load or increase of the cantilever bending from the contact point "a-x microns" which means the tip is less driven into the surface after half of the pattern is executed. This behavior is observed due to driving the tip into the surface beyond the initial contact point. These tips can be designed to be bent from the lever plane with a constant freedom of travel (FOT). FOT is the difference in distance between the stylus of the tip and the chip pedestal, as shown in FIG. 2B. For this typical 2D chip the FOT is 16.8 µm and this number varies between chips.

Figure 3:
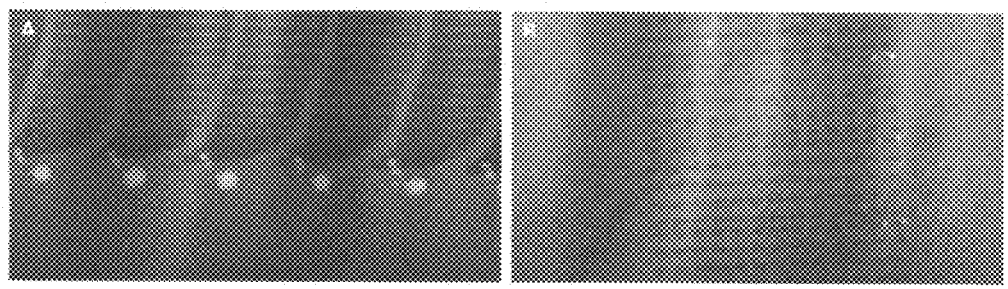
FIG. 3: Formation of negative features in the form of lines instead of dots.

An additional issue arising from exerting a high load onto the surface or driving the tip into the surface beyond the initial contact point is the deformation and formation of negative features in the form of lines instead of dots. This effect depends on how much the tip is driven into the surface and whether the rectangular array can be skewed or not, as seen in FIG. 3. FIG. 3A shows the formation of negative lines within a skewed array instead of positive bright dots similar to the bright approach dots at the beginning of each array. Similarly FIG. 3B shows the formation of negative lines within a rectangular array instead of positive bright dots similar to the bright approach dots at the beginning of each array. These arrays are not skewed because the tips were driven beyond the contact point into the surface but did not pass the threshold for the skewing effect.

Figure 4:
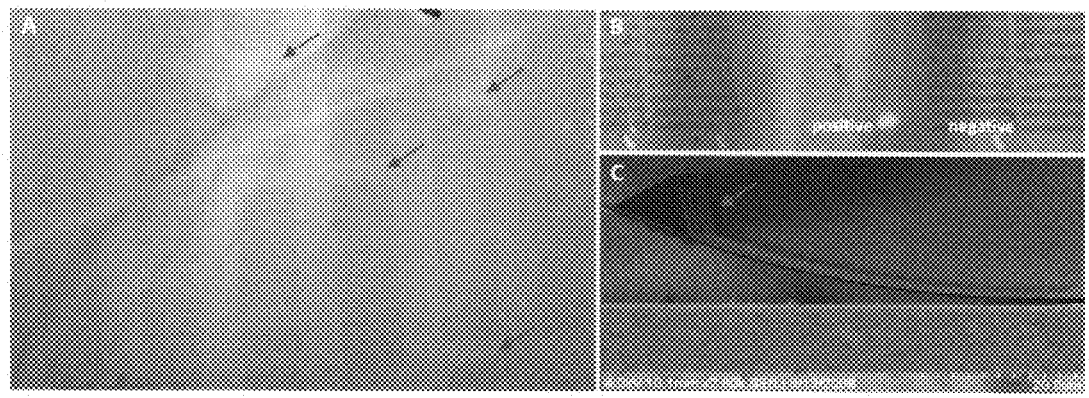
FIG. 4: Tip quality. (A) Missing tips resulted in missing arrays. (B) When tips are out of plane, positive and negative pattern exists side by side. (C) SEM image of out of plane tips.

Quality of the 2D PenArray plays an important role if a large area fabrication is desired; any missing or damaged tips on the chip, the planarity of tips, and the existing of out-of-plane tips will lead to a non homogeneous substrate fabrication. FIG. 4 shows a substrate fabricated using a 2D pen array with missing and out-of-plane tips. In FIG. 4A there are several missing arrays indicated by red arrows. These missing arrays are directly related to missing tips due to tip manufacturing or damage during shipping and assembly. During tip manufacturing some out-of-plane tips might have more or less bending, which can lead to different patterns being fabricated, as shown in the optical image in FIG. 4B, where positive and negative patterns were generated side by side due to the different contacts between the tips and the surface. An out of plane tip is shown in FIG. 4C indicated by a red arrow.

Instrumentation

Instrumentation which can be used to practice embodiments described herein include instruments from NanoInk, Inc. including the NSCRIPTOR, DPN5000, and NLP 2000 and components related to these instruments including inks, substrates, software, and the like. Instruments can enable direct write lithography including nanolithography. An instrument for patterning is described in, for example, US patent publication 2009/0023607 to Rozhok et ai, published Jan. 22, 2009.

Massively parallel two dimensional arrays are described in, for example, US patent publication 2008/0105042 published May 8, 2008 to Mirkin, Fraga/a, et al.

Improved arrays comprising viewports are described in, for example, U.S. patent application Ser. No. 12/073,909 filed Mar. 11, 2008 to Haaheim et al. (PCT publication WO 2008/0309688 published Dec. 18, 2008)

Direct write nanolithography with use of tips and deposition materials, including thiols and other sulfur compounds, is described in, for example, U.S. Pat. Nos. 6,635,311 and 6,827,979 to Mirkin et al. Parallel probe arrays are described in, for example, U.S. Pat. No. 6,867,443 to Liu et al.

See also: (1) "Applications of dip-pen nanolithography" Salaita et al., *Nature Nanotechnology*, vol. 2, March 2007, 145-155, (2) "Dip Pen Nanolithography: A Desktop Nanofab Approach Using High Throughput Flexible Nanopatterning, Haaheim, *Scanning,* 2008, 30, 137-150, (3) "The Evolution of Dip-Pen Nanolithography" Ginger, *Angewandte Chemie,* 2004, 43, 30-45.

Etching patterned surfaces is described in, for example, U.S. Pat. No. 7,291,284 to Mirkin et al.

Scanning probe contact printing is described in, for example, U.S. Pat. No. 7,344,756.

Software to control nanolithographic instrumentation and processes is described in, for example, U.S. Pat. No. 7,060,977 to Cruchon-Dupeyrat and U.S. Pat. No. 7,279,046 to Nelson et al.

Alignment methods are described in, for example, U.S. patent application Ser. No. 11/848,211 filed Aug. 30, 2007 which is hereby incorporated by reference.

Cantilevers and Arrays of Cantilevers

Cantilevers are known in the art and can be, for example, AFM cantilevers. The cantilevers can comprise tips thereon including for example solid tips, hollow tips, nanoscopic tips, scanning probe microscope tips, and AFM tips. Known materials can be used including, for example, silicon nitride and silicon. Cantilevers and tips can be adapted for high density arrays. For example, the cantilevers can be bowed and the tips can be lengthened.

One embodiment is an article comprising: (i) a two-dimensional array of a plurality of cantilevers, wherein the array comprises a plurality of base rows, each base row comprising a plurality of cantilevers extending from the base row, wherein each of the cantilevers comprise tips at the cantilever end away from the base row, wherein the arrays are adapted to prevent substantial contact of non-tip components of the array when the tips are brought into contact with a substantially planar surface; and (ii) a support for the array.

One embodiment also provides an article comprising: (i) a two-dimensional array of a plurality of cantilevers, wherein the array comprises a plurality of base rows, each base row comprising a plurality of cantilevers, wherein each of the cantilevers comprise tips at the cantilever end away from the base, wherein the number of cantilevers is greater than 250, and wherein the tips have an apex height relative to the cantilever of at least, for example, four microns, and (ii) a support for the array.

Another embodiment provides an article comprising: a two-dimensional array of a plurality of cantilevers, wherein the array comprises a plurality of base rows, each base row comprising a plurality of cantilevers, wherein each of the cantilevers comprise tips at the cantilever end away from the base, wherein the number of cantilevers is greater than 250, and wherein the tips are coated with metal on the tip side of the cantilever and the cantilevers are bent at an angle of, for example, at least 10° from their base.

Two-dimensional arrays of cantilevers are known in the art. For example, the two-dimensional array can be a series of rows and columns, providing length and width, preferably substantially perpendicular to each other. The arrays can comprise a first dimension and a second dimension. The two-dimensional array can be a series of one dimensional arrays disposed next to each other to build the second dimension. The two dimensions can be perpendicular. The cantilevers can comprise a free end and a bound end. The cantilevers can comprise tips at or near the free end, distal from the bound end. The cantilevers of one row can point in the same direction as the cantilevers on the next row, or the cantilevers of one row can point in the opposite direction as the cantilevers on the next row.

The two-dimensional arrays can be fabricated by combining two parts, each part having a surface which is patterned in two dimensions and adapted to be mated with each other in the two dimensions.

One important variable is the fraction or percentage of the cantilevers in the array which can actually function for the intended purposes. In some cases, some cantilevers can be imperfectly formed, or can be otherwise damaged after formation. A cantilever yield reflects this percentage of usable cantilevers. Preferably, the array is characterized by a cantilever yield of at least 75%, or at least 80%, or at least 90%, or at least 95%, or more preferably, at least about 98%, or more preferably at least 99%. In characterizing the cantilever yield, cantilevers at the ends of rows may be neglected which are damaged by processing of edges compared to internal cantilevers. For example, the central 75% can be measured. In many cases, the fabrication will be better done in the middle rather than the edge as edge effects are known in wafer fabrication. Defect density can increase in some cases as one moves from the center to the edge.

The array can be adapted to prevent substantial contact of non-tip components of the array when the tips are brought into contact with a substantially planar surface. For example, the cantilever arms should not contact the surface and can be accordingly adapted such as by, for example, bending. The tips can be adapted for this as well including, for example, long tips. Factors which can be useful to achieve this result include use of long tips, bending of the cantilever arms, tip leveling, row leveling, and leveling of the cantilevers in all dimensions. One or more combination of factors can be used.

The cantilever tips can be longer than usual in the art. For example, the tips can have an apex height relative to the cantilever of at least four microns on average, and if desired, the tips can have an apex height relative to the cantilever of at least seven microns on average. In addition, tip apex height can be at least 10 microns, or at least 15 microns, or at least 20 microns. No particular upper limit exists and technology known in the art and improving can be used. This long length can help ensure that only tips are contacting the surface. Apex height can be taken as an average of many tip apex heights, and in general, apex height is engineered not to vary substantially from tip to tip. Methods known in the art can be used to measure tip apex height including methods shown in the working examples.

In measuring parameters for the array, average measurements can be used. Average measurements can be obtained by methods known in the art including for example review of representative images or micrographs. The entire array does not need to be measured as that can be impractical.

Tipless cantilevers can be used in some embodiments, although not a preferred embodiment. For example, one embodiment provides an article comprising: (i) a two-dimensional array of a plurality of cantilevers, wherein the array comprises a plurality of base rows, each base row comprising a plurality of cantilevers extending from the base row, wherein each of the cantilevers are tipless cantilevers, wherein the cantilevers are bent at an angle from their base.

In addition, the cantilevers can be bent including bent towards the surface to be patterned. Methods known in the art can be used to induce bending. The cantilevers can be bent at an angle away from the base and the support. The cantilevers can comprise multiple layers adapted for bending of cantilevers. For example, differential thermal expansion or cantilever bimorph can be used to bend the cantilevers. Cantilever bending can be induced by using at least two different materials. Alternatively, the same materials can be used but with different stresses to provide cantilever bending. Another method is depositing on the cantilever comprising one material a second layer of the same material but with an intrinsic stress gradient. Alternatively, the surface of the cantilever can be oxidized. The cantilevers can be bent at an angle for example of at least 5° from their base, or at least 10° from their base, or at an angle of at least 15° from their base. Methods known in the art can be used to measure this including the methods demonstrated in the working examples. Average value for angle can be used. The cantilevers can be bent on average about 10 microns to about 50 microns, or about 15 microns to about 40 microns. This distance of bending can be measured by methods known in the art including the methods demonstrated in the working examples. Average distance can be used. The bending can result in greater tolerance to substrate roughness and morphology and tip misalignment within the array so that for example a misalignment of about ±20 microns or less or about ±10 microns or less can be compensated.

To facilitate bending, the cantilevers can comprise multiple layers such as two principle layers and optional adhesion layers and can be for example bimorph cantilevers. The cantilevers can be coated with metal or metal oxide on the tip side of the cantilever. The metal is not particularly limited as long as the metal or metal oxide is useful in helping to bend the cantilevers with heat. For example, the metal can be a noble metal such as gold.

In preferred embodiments, the array can be adapted so that the cantilevers are both bent toward the surface and also comprise tips which are longer than normal compared to tips used merely for imaging.

The tips can be fabricated and sharpened before use and can have an average radius of curvature of, for example, less than 100 nm. The average radius of curvature can be, for example, 10 nm to 100 nm, or 20 nm to 100 nm, or 30 nm to 90 nm. The shape of the tip can be varied including for example pyramidal, conical, wedge, and boxed. The tips can be hollow tips or contain an aperture including hollow tips and aperture tips formed through microfabrication with microfluidic channels passing to end of tip. Fluid materials can be stored at the end of the tips or flow through the tips.

The tip geometry can be varied and can be for example a solid tip or a hollow tip. WO 2005/115630 (PCT/US2005/014899) to Henderson et al. describes tip geometries for depositing materials onto surfaces which can be used herein.

The two dimensional array can be characterized by a tip spacing in each of the two dimensions (e.g., length dimension and width dimension). Tip spacing can be taken, for example, from the method of manufacturing the tip arrays or directly observed from the manufactured array. Tip spacing can be engineered to provide high density of tips and cantilevers. For example, tip density can be at least 1,000 per square inch, or at least 10,000 per square inch, or at least 40,000 per square inch, or at least 70,000 per square inch. The array can be characterized by a tip spacing of less than 300 microns in a first dimension of the two dimensional array and less than 300 microns in a second dimension of the two dimensional array. To achieve even higher density, the tip spacing can be, for example, less than about 200 microns in one dimension and less than about 100 microns, or less than about 50 microns, in another dimension. Alternatively, the tip spacing can be for example less than 100 microns in one dimension and a less than 25 microns in a second direction. The array can be characterized by a tip spacing of 100 microns or less in at least one dimension of the two dimensional array. In one embodiment, tip spacing can be about 70 microns to about 110 microns in one dimension, and about 5 microns to about 35 microns in the second dimension. There is no particular lower limit on tip spacing as fabrication methods will allow more dense tip spacing over time. Examples of lower limits include 1 micron, or 5 microns, or 10 microns so for example tip spacings can be one micron to 300 microns, or one micron to 100 micron.

The number of cantilevers on the two dimensional array is not particularly limited but can be at least about three, at least about five, at least about 250, or at least about 1,000, or at least about 10,000, or at least about 50,000, or at least about 55,000, or at least about 100,000, or about 25,000 to about 75,000. The number can be increased to the amount allowed for a particular instrument and space constraints for patterning. A suitable balance can be achieved for a particular application weighing for example factors such as ease of fabrication, quality, and the particular density needs.

The tips can be engineered to have consistent spacing for touch the surface consistently. For example, each of the tips can be characterized by a distance D spanning the tip end to the support, and the tip array is characterized by an average distance D' of the tip end to the support, and for at least 90% of the tips, D is within 50 microns of D'. In another embodiment, for at least 90% of the tips, D is within 10 microns of D'. The distance between the tip ends and the support can be for example about 10 microns to about 50 microns. This distance can comprise for example the additive combination of base row height, the distance of bending, and the tip height.

Base row length is not particularly limited. For example, the base rows can have an average length of at least about 1 mm. Average length for base row can be, for example, about 0.1 mm to about 30 mm, or about 0.1 mm to about 15 mm, or about 0.1 mm to about 5 mm, or about 0.5 mm to about 3 mm.

The base rows can have a height with respect to the support of at least about 5 microns. This height is not particularly limited but can be adapted for use with the appropriate cantilever bending.

Cantilever force constant is not particularly limited. For example, the cantilevers can have an average force constant of about 0.001 N/m to about 10 N/m, or alternatively, an average force constant of about 0.05 N/m to about 1 N/m, or alternatively an average force constant of about 0.1 N/m to about 1 N/m, or about 0.1 N/m to about 0.6 N/m.

A variety of methods can be used for bonding the cantilevers to the base, and the methods are not particularly limited. Bonding methods are described for example in Madou, *Fundamentals of Microfabrication,* 2nd Ed., pages 484-494 which describes for example field-assisted thermal bonding, also known as anodic bonding, electrostatic bonding, or the Mallory process. Methods which provide low processing temperature can be used. For example, the cantilevers can be bound to the base by a non-adhesive bonding. Bonding examples include electrostatic bonding, field-assisted thermal bonding, silicon fusion bonding, thermal bonding with intermediate layers, eutectic bonding, gold diffusion bonding, gold thermocompression bonding, adhesive bonding, and glass frit bonding.

The cantilevers can be engineered so they are not adapted for feedback including force feedback. Alternatively, at least one cantilever can be adapted for feedback including force feedback. Or substantially all of the cantilevers can be adapted for feedback including force feedback. For example, over 90%, or over 95%, or over 99% of the cantilevers can be adapted for feedback including force feedback.

The cantilevers can be bound to the base by electrostatic binding.

The cantilevers can be made from materials used in AFM probes including for example silicon, polycrystalline silicon, silicon nitride, or silicon rich nitride. The cantilevers can have a length, width, and height or thickness. The length can be for example about 10 microns to about 80 microns, or about 25 microns to about 65 microns. The width can be for example 5 microns to about 25 microns, or about 10 microns to about 20 microns. Thickness can be for example 100 nm to about 700 nm, or about 250 nm to about 550 nm. Tipless cantilevers can be used in the arrays, the methods of making arrays, and the methods of using arrays.

The cantilevers can be supported on the base rows, and the base rows in turn can be supported on a larger support for the array. The base rows can extend from the larger support for the array. The array support can be characterized by a surface area which is about two square cm or less, or alternatively about 0.5 square cm to about 1.5 square cm. The size can be adjusted as needed for coupling with an instrument.

Arrays can be adapted for passive pen or active pen use. Control of each tip can be carried out by piezoelectric, capacitive, or thermoelectric actuation, for example.

In one embodiment, distant between adjacent tips can be, for example, 5 to 100 nm in an x-direction, and 50 microns to 150 microns in a y-direction. For example, in the examples below, bright dots can be seen in the x-direction spaced 20 nm apart, which is the same distance between two adjacent tips. These dots are spaced 90 μm in the y-direction, which is the total length of the cantilever.

Inks

The tips can be coated with a patterning compound or ink material. The coating is not particularly limited; the patterning compound or ink material can be disposed at the tip end. Patterning compounds and materials are known in the art of nanolithographic printing and include organic compounds and inorganic materials, chemicals, biological materials, non-reactive materials and reactive materials, molecular compounds and particles, nanoparticles, materials that form self assembled monolayers, soluble compounds, polymers, ceramics, metals, magnetic materials, metal oxides, main group elements, mixtures of compounds and materials, conducting polymers, biomolecules including nucleic acid materials, RNA, DNA, PNA, proteins and peptides, antibodies, enzymes, lipids, carbohydrates, and even organisms such as viruses. The references described in this application, including U.S. Pat. No. 6,827,979, describe many patterning compounds which can be used. Sulfur-containing compounds including thiols and sulfides can be used.

Materials to be deposited, or inks, are known in the art and can be, for example, functionalized organic compounds including for example functionalized thiols. For example, the ink can be represented as X—R—Y, wherein Y is a functional group adapted for interaction with a substrate surface, R is a spacer group such as an alkylene group, and X is a group such as amino, carboxylic acid, hydroxyl, amino, or alkyl.

Vapor Deposition

To achieve good patterning, controlled vapor deposition can be carried out. For example, one embodiment provides an article comprising: at least one array of cantilevers comprising tips, wherein the cantilevers comprising tips are adapted for deposition of a material from the tip onto a substrate, wherein the array has a tip density of at least 1,000 per square inch, and wherein the array is homogeneously coated with the material in an amount which is limited to substantially prevent non-specific deposition of the material onto the substrate.

Another embodiment provides a method comprising: vapor coating at least one material onto an array of cantilevers comprising tips, wherein the cantilevers comprising tips are adapted for deposition of the material from the tip onto a substrate, wherein the array has a tip density of at least 1,000 per square inch, and wherein the amount of material vapor coated is limited to substantially prevent non-specific deposition of the material onto the substrate. Vapor deposition is known in the art. See, for example, U.S. Pat. No. 6,827,979 to Mirkin et al. An array of cantilevers, wherein the cantilevers comprise tips, can be adapted for vapor deposition of materials onto the tips.

Depositing inks onto tips is also described in, for example, U.S. Pat. No. 7,034,854 and also U.S. patent application Ser. No. 12/222,464 filed Aug. 8, 2008 to Mirkin et al.

The deposition of material on the tips can be a homogeneous deposition which provides for improved deposition of material from the tips to a substrate. For example, the amount of non-specific deposition can be minimized or substantially eliminated. High density tip arrays can be used, including two dimensional high density arrays.

The tips cap be nanoscopic tips, scanning probe microscope tips, atomic force microscope tips, hollow tips, or solid tips.

Vapor deposition can be executed at pressures below one atmosphere. The pressure can be, for example, 300 mtorr or less, although the pressure can be any pressure below 760 torr, as long as the desired pressure can lower the melting point of the compound used to coat the tips evenly.

Leveling

U.S. Provisional Application 61/026,196 filed Feb. 5, 2008 to Haaheim et al. describes leveling methods and software and instrumentation in various embodiments and is incorporated herein by reference in its entirety. Leveling is also described in, for example, WO 2009/132,321 published Oct. 29, 2009 (Northwestern University).

A cantilever can be provided, comprising at least one tip at one end, which comprises at least one relatively bright spot, or a marker, near the tip upon viewing. The cantilever can be part of an array of cantilevers. The cantilevers and tips can be, for example, AFM cantilevers or AFM tips.

The cantilever fabrication can be adapted to provide the bright spots near the tip.

The cantilever and the substrate can be moved closer to each other.

When the tip contacts the substrate surface, the relatively bright spot can be viewed to determine contact of the tip and the substrate. The relatively bright spot can become more dim, or dimmer, and at some point completely disappear as the tip is driven into the substrate.

The marker, or relatively bright spot, can be two relatively bright spots, including at least two red relatively bright spots.

The change in brightness can represent about one micron to about ten microns of movement to the substrate, or about three microns to about five microns.

The array can be part of a two dimensional array, and the array can comprise at least one viewport, or at least six viewports, for viewing the marker and bright spot.

The leveling steps can be part of a larger process comprising at least one macroscopic leveling step and at least one microscopic leveling step.

One can level with use of bright spots at the tip as opposed to reflections from the cantilever.

An array of cantilevers can be prepared with the cantilevers at the ends showing the bright spots for leveling.

Temperature Control Substrates

The temperature of the substrate can be adapted to control a size of the material deposit. For example, one embodiment provides a method comprising: providing at least one cantilever comprising at least one tip thereon, and a material deposited on the tip, contacting the cantilever with a substrate so that the material is deposited from the tip onto the substrate to form a material deposit, wherein the temperature of the substrate is adapted to control a size of the material deposit.

Another embodiment provides a device comprising: at least one heat sink, at least one heating or cooling stage, at least one vacuum system, wherein the device is adapted to function with a substrate to be subjected to a material deposition and to keep the substrate temperature substantially constant during deposition.

Another embodiment provides a method comprising: controlling the rate of deposition of a material from a tip to substrate by controlling the temperature of the substrate with use of a device attached directly to the substrate.

For example, the temperature of the substrate can be adapted to be below or above 25° C. With lowering of temperature, the size of the material deposit can be reduced or made less. In particular, size can be made less with respect to the size if deposition carried out at 25° C. For example, a diameter or width can be reduced. Substrate temperature can be lowered below, for example, 20° C., or below 15° C., or below 10° C. A temperature range can be, for example, 5° C. to 25° C.

In addition, constant temperature levels can be achieved. For example, the temperature of the substrate can be adapted to provide a substantially constant temperature for at least 30 minutes, or at least one hour, or at least five hours, or at least ten hours, or at least twenty hours, or at least 48 hours.

A device can be used to control the temperature of the substrate. For example, a device can comprise at least one heat sink, at least one heating stage or at least one cooling stage, at least one vacuum system. The vacuum system can be used to hold the substrate. The device can directly contact the substrate. The heat sink can comprise a high thermally conductive metal such as, for example, aluminum, copper, or other metals. The heat sink can comprise stacked or spaced metallic blocks, and can comprise fins. A thermoelectric cooler or heater can be used. Peltier devices are known in the art. See, for example, U.S. Pat. Nos. 5,171,992 (Claber) and 7,238,294 (Koops). The device can be adapted for use with a nanolithography instrument including, for example, use with an environmental chamber for the substrate.

The voltage and current which causes the temperature control can be used as a pulse current or a substantially constant current.

The temperature of the substrate can be adapted so that deposited material can have a lateral dimension of about 500 nm or less, or about 100 nm or less. A range can be, for example, about 15 nm to about five microns, or about 50 nm to about one micron. The deposited material can be a dot or a line, and the lateral dimension can be a dot diameter or a line width.

The sample stage comprising temperature control can be, for example, a machined piece of copper with a smaller metal cap on top, between which lies a TEC (Thermo Electric Cooler). The top piece can have, for example, an RTD embedded in it and a whole on the top in the center which allows using a vacuum to hold the sample in place. These metal parts can be made of any material with similar thermal characteristics.

Fins can be used to increase the heat diffusion rate of the lower section of the sample stage when in cooling mode by presenting a large surface area to the surrounding air. The top plate has the smallest amount of surface available; this inhibits the heat from radiating when in the hot mode, and the cool from absorbing the ambient temperature when in cool mode. This design would benefit from; covering the edges and the area just outside of the sample with insulation. Aerogel can be used.

The control box can be made up of an off the shelf Watlow PID controller, an RTD temperature sensor, a 12V DC power supply, and an amplifier circuit. One can design the amplifier using two NPN transistors. The output of a Watlow controller can drive this two transistor amplifier. The amplifier can drive the TEC (Thermo Electric Cooler) with nearly constant current providing a low noise stage.

The stage can be used for both heating and cooling. The TEC can be placed with the hot side up for heating and with the cool side up for cooling.

Cell Engineering

Biological cells and cell biology are generally known in the art. See, for example, *Cell Biology*, 2nd Ed., Pollard & Earnshaw, 2008. Cells can be prokaryotic or eukaryotic. Cells can be somatic. Cells can be totipotent, pluripotent, multipotent, unipotent, capable of self-renewal, and/or capable of differentiation. Cells can be progenitor cells, terminally differentiated cells, and the like. A wide variety of cells can be examined and commercially used by methods and devices described herein.

In addition, stem cells and stem cell biology are generally known in the art. See, for example, *Essentials of Stem Cell Biology*, ed. R. Lanza, 2006; Ferreira et al., Cell Stem Cell 3, Aug. 7, 2008, 136-146. Examples of stem cells include, without limitation, adult stem cells and embryonic stem cells; human stem cells; mammalian stem cells; murine stem cells; hematopoietic stem cells, neural stem cells, muscle stem cells; mesenchymal stem cells; skin stem cells; and embryonic stem cells. Stem cells can be taken from different organs including, for example, the liver and the pancreas. In one embodiment, human embryonic stem cells are excluded from the types of stem cells which can be used.

Cell lineages include, without limitation, osteogenic lineages, chondrogenic lineages, neurogenic lineages, adipogenic lineages, and myogenic lineages.

In vitro conditions for controlling stem cell proliferation and differentiation are known in the art.

Tissue engineering is generally known in the art. See, for example, *Principles of Tissue Engineering*, 2nd Ed., ed. Lanza et al. 2000; see, Burdick, Tissue Engineering, Vol 14, 00, 2008, 1-15. Cells can be grown in two dimensional and three dimensional environments.

Patterning and stem cell differentiation are described in, for example, UK provisional application 08127899.6 filed Jul. 12, 2008 and U.S. provisional application 61/099,182 filed Sep. 22, 2008 to Curran et al. (see also, PCT/IB2009/006521 filed Jul. 10, 2009 and U.S. provisional application 61/295,133 filed Jan. 14, 2010) Examples of different cells and stem cells are described therein.

Edge-to-edge patterning is desired so that the substrate is homogeneous in its contact with other objects such as, for example, cells including, for example, stem cells. Cell adhesion, proliferation, and differentiation are known in the art. See, for example, Kong et al., PNAS, Mar. 22, 2005, vol. 102, no. 12, 4300-4305; Lee et al., Nano Letters, 2004, 4, 8, 1501-1506.

Stem cells in a micro-environment are described in, for example, Saha et al., Current Opinion in Chemical Biology, 2007, 11, 381-387.

Cell adhesion and growth is described in, for example, Arnold et al., ChemPhysChem 2004, 5, 383-388.

Cell morphology and nanopatterns-induced changes are described in, for example, Vim et al., Biomaterials, 2005, 26, 5405-5413.

WORKING EXAMPLES

DPN parameters have been developed and controlled to pattern a variety of inks on gold using single and 1D tips, and a known inking process for these tips is dipcoating. Homogeneous tip coating is a key parameter in DPN for fabrication of homogeneous structures. However, this can be difficult to achieve commercially by dipcoating due to the formation of thiol crystals on the tips in an arbitrary fashion. For high throughput and large area fabrication homogeneous ink coating of the pen tips can be achieved by using 2D pen arrays. The 2D chip cannot be coated by solution dip-coating due to the bridging of thiol crystals across the tips and the silicon support, and the damage that might occur to the tips due to the solvent upon dipping and drying.

Example 1

Vapor Coating

To coat these tips homogeneously, new procedures based on vapor-coating were developed for several thiol inks and these procedures depend on their melting points if solids and boiling points if liquids. The 2D pen arrays were vapor-coated using a vacuum oven. When vapor-coating the tips under vacuum this will lower the melting points of the thiol inks to a desired working temperature. This was done to facilitate the evaporation of these molecules into the gas phase and to condense these thiol molecules back onto the pen tips. The pen arrays were placed directly above the solid ink materials in a closed container. The coating was done between 50 and 90° C. depending on the melting point of the thiol compound at 760 torr. The pressure used for coating was under 300 mtorr. The coating process comprised at least two or three timed cycles using a programmable oven. The first cycle involved loading the chips and the thiol compound into a tin, the tin being wrapped in aluminum foil. The oven chamber was pumped down to reach a pressure of −300 mtorr or less, which can be reached in an hour. Then the temperature was increased gradually to the desired setpoint. The temperature was maintained constant at this setpoint for 3 hours followed by gradual cooling to 25° C. for 6 hours. The system was then left at room temperature over night. This entire process was repeated three times to ensure homogeneous coating of the pen tips.

Figure 5:
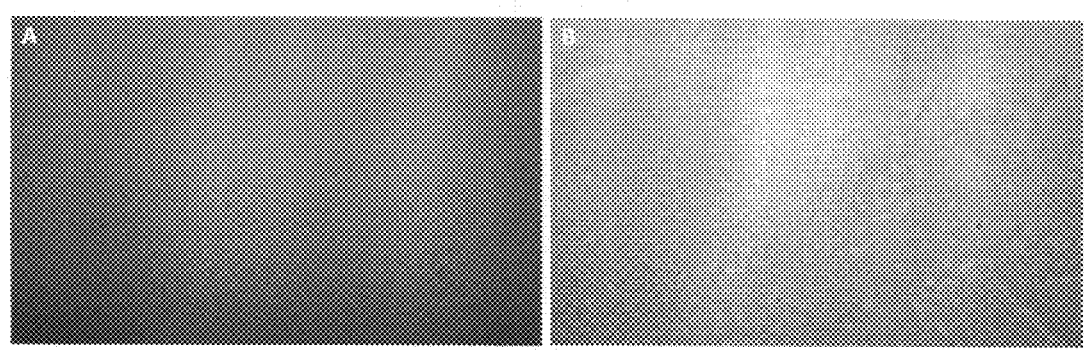
FIG. 5: 2D chip vapor-coating. (A) Optical image showing approach dots across the whole substrate. (B) Non specific deposition of thiol molecules due to chip over coating.

Besides cycling under vacuum, a minimum amount of the desired thiol compound was weighed. This desired amount was determined by running several experiments and varying the amount used each time when coating a chip to find the average amount needed to evenly coat the 2D pen array. This was done to avoid any excess coating which leads to non-specific deposition. An example is shown in FIG. 5A of a 2D pen array coated using the above procedure. Bright dots can be seen in the x-direction spaced 20 nm apart, which is the same distance between two adjacent tips. These dots are spaced 90 Um in the y-direction, which is the total length of the cantilever. The dots appear homogeneous across the whole 1-cm2 substrate as seen in this optical image, where only a section of the substrate is captured (an 1100×670 IJm2 area).

Nonhomogeneous dots result in a nonhomogeneous coating, as shown in FIG. 5B. In addition to different spot sizes a non-specific deposition is observed across the sample due to a nonhomogeneous coating and an excess of thiol molecules on the tips and the back of the chip, as seen in the optical image FIG. 5B.

Example 2

Leveling

Figure 6:
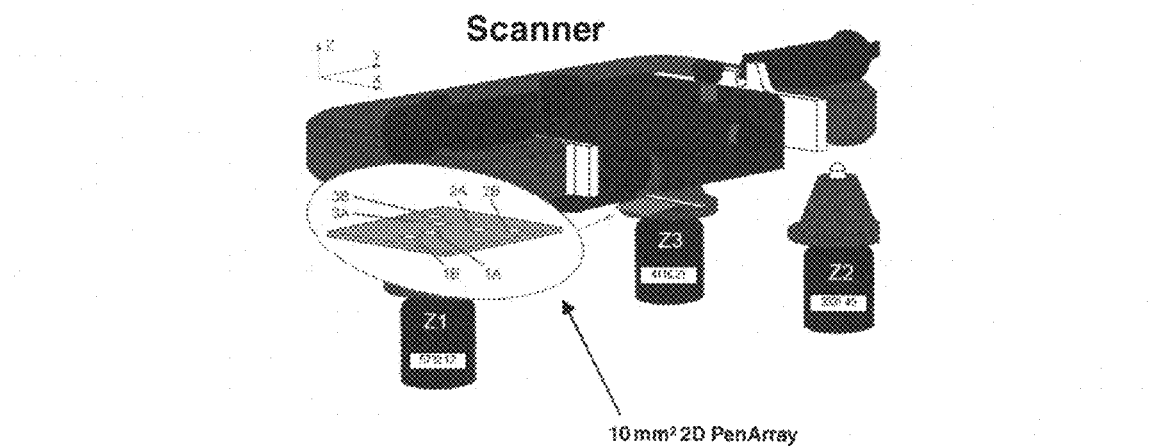
FIG. 6: 2D Nano PenArray mounted on a scanner, which is rested on three z-axis motors.

To achieve homogeneous and high-quality patterning, issues stated above should be resolved. The new improved procedure addresses how to level the 2D nano PrintArray with respect to the substrate surface and how to guarantee that all tips are uniformly, but only slightly in contact with the surface with approximately the same load. The leveling was performed via the NanoInk NSCRIPTOR™ in conjunction with a 2D-leveling user interface, also developed by NanoInk. The leveling was performed in two steps, one at macro-scale and one at micro-scale using a more precise optical deflection. First, macroscale leveling was accomplished by eyeballing the parallelness of the 2D chip to the substrate using the z-axis motors of the scanner FIG. 6. At this point the 2D chip is still a few hundred microns above the surface. Second, pen cantilevers are bent towards the surface and were brought into focus using the optics of the instrument, at this point leveling is performed using the precise optical deflection in conjunction with a leveling protocol. Changes in the cantilevers were monitored through the viewports (A1-3 and B1-3 as shown in the insert of FIG. 6) and these changes were controlled by the z-motors and z-piezo.

The following steps were used to level the 2D chip to the surface to be patterned:

1) The optics is focused onto the viewport where the underlying cantilever can be viewed through the silicon support structure, the optical system on the instrument is used to determine whether the cantilevers are leveled or not.

Figure 7:
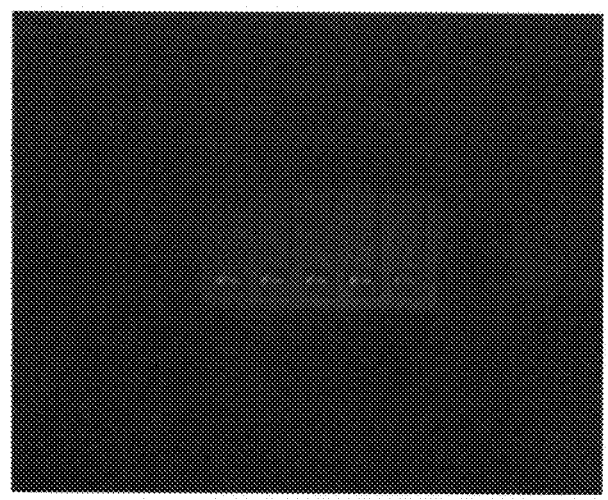
FIG. 7: Cantilevers viewed though a viewport.

2) The arm of cantilevers as seen through the viewports in FIG. 7 looks greenish, and the tip which is the inverted pyramid has two red dots on the base.

3) As the tips approach the surface using the z-motors and using the optics to monitor any of the 6 viewports to about a few tens of microns above the surface, there is no shift or change in the color of the arm of the cantilever.

Figure 8:
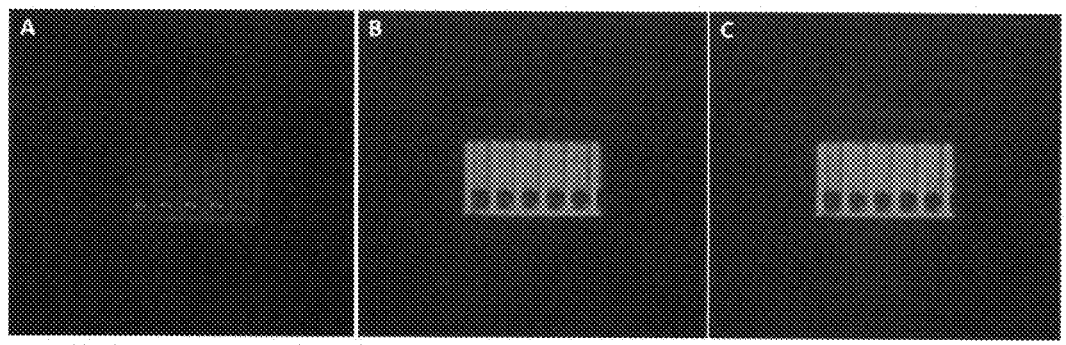
FIG. 8: Fine leveling approach using the "Alligator Eye" Procedure.

4) Before and after contact the change in cantilever appearance is shown in FIG. 8. The appearance of the tips changes as they move through different states above the surface, when they make initial contact with the substrate surface, and when the z-piezo is driven a few microns beyond the first contact with the surface, as shown in FIGS. 8A, B, and C respectively. The observed change is in the two red dots at the end of the cantilever. When the cantilever is above the surface, two bright dots are seen, FIG. 8A, but when the tips are brought into contact with the surface, the two bright dots start to dim, FIG. 8B. At this point the tips are just beginning to touch the surface. Finally, when the tips are driven into the surface farther, the two red dots disappear completely. The position from the initial touch to the total dimming of the red dots is between 3 and 5 micron, the precisely amount varying between chips. This new leveling procedure can be called "Alligator-Eyes Leveling Approach." While not limited by theory, the two red dots appear to appear from the cantilever and tip design and natural light (not, for example, laser light).

5) After observing and noting the relative "eyes-dimming" characteristics of the cantilevers at each viewport when in contact with the surface, the z-all position of the entire array is noted. For each viewport the z-probe value (read from the z-piezo position) is noted when the tips are in contact with the surface and the red dots dim; these two values are added together and input into the leveling software. This process is repeated for three viewports.

6) After inputting these parameters into the leveling software, "Execute Leveling" is pressed and the individual z-axis motors correct their positions based upon the input zprobe values. This procedure is repeated until the difference in z-position between the three viewports is less than a micron.

7) Using any viewport of choice, the array is brought into contact with the surface using z-all position and the final approach is carried out at increments of less than 1 micron until the cantilevers touch the surface. The piezo is fully extended, until all viewports show the same change in eyes-dimming, and the z-all is withdrawn a micron or so. At this point the system is leveled and all the tips are touching the surface uniformly, and the designed lithographic arrays can be executed.

8) Using this approach an initial z-position of anywhere from 100 nm to a few microns after initial contact and up to total eyes diming can yield an excellent lithography with uniform contact and homogeneous fabrication. However, when the eyes are totally red before contact, the 2D pen array may not pattern any dots at all. When the red dots disappear upon complete dimming of the eyes and the tips are pushed further into the substrate, deflection starts to occur on the back of the cantilevers as shown in FIG. 1, and this will lead to distorted patterning.

9) After leveling the designed patterns is executed, and the tips as seen from any viewport start to blink as they go in and out from the surface (red eyes no contact—dim eyes in contact).

10) Besides leveling, good care and practice must be followed in loading the sample onto the sample holder. The back of the sample must be free of any debris or small contamination which will make it hard to level the system; this is achieved by wiping the sample holder and the back of the substrate with organic solvent such as acetone followed by air or nitrogen dry.

11) The substrate needs to be centered with respect to viewports 2 and 3.

12) Different DPN environmental conditions must be used for each different type of thiol ink.

13) Once the 2D PenArray is leveled on the system, different samples can be fabricated simultaneously with minor leveling between each sample.

This leveling technique provides a fast and accurate method to level a 2D chip with respect to the substrate, thereby providing uniform contacts between the cantilevers and the surface which will lead to reproducible, accurate, and homogeneous patterning across large substrates.

Figure 9:
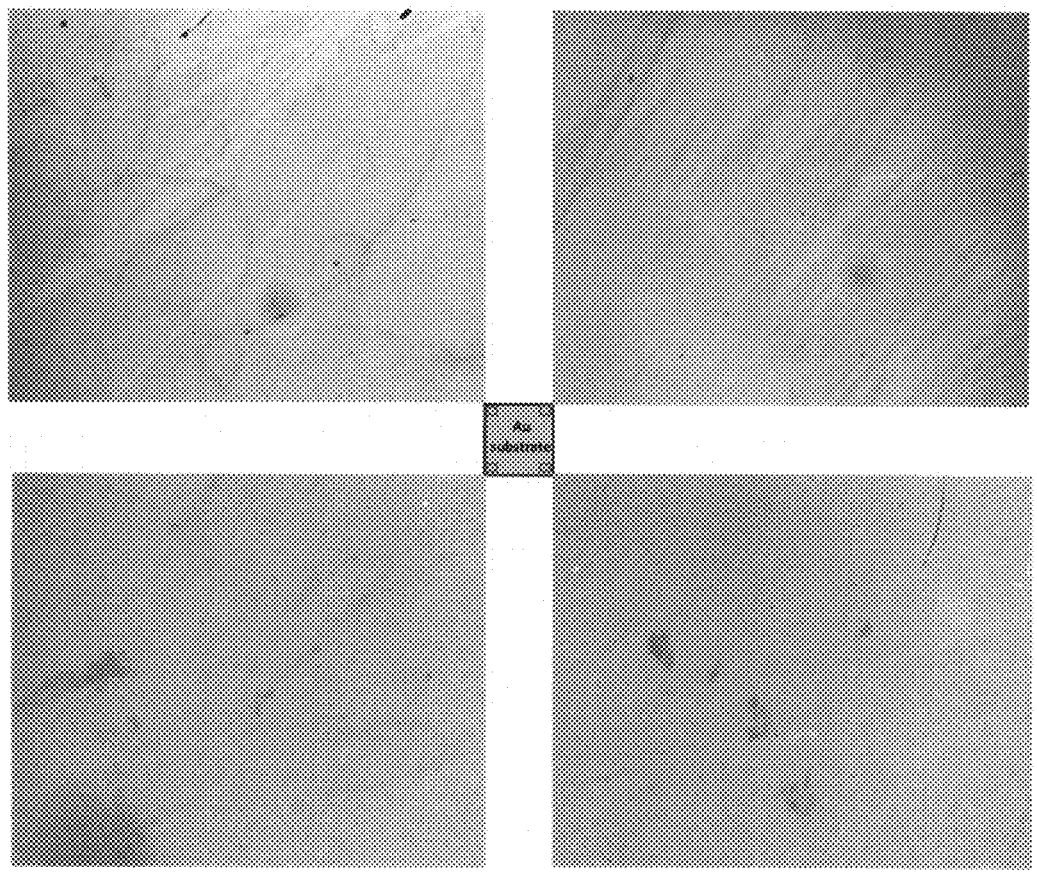
FIG. 9: Optical images of the four corners of 5 square mm patterned substrate using the Alligator-Eyes leveling procedure.

FIG. 9 presents an example of patterning a 5 mm$^2$ sample from edge-to-edge, homogeneous dots are fabricated across the entire area shown in this optical microscope image which represent a 5 mm$^2$ etched gold substrate after fabrication to lead to a uniform and homogeneous 4×6 dot arrays across the areas, below is a section of the four corners of the fabricated substrate showing the homogeneity of the structures.

Figure 10:
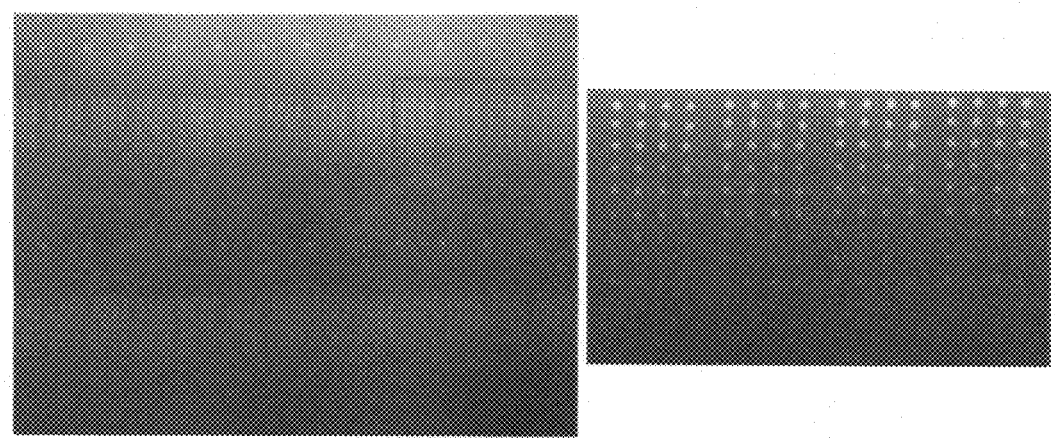
FIG. 10: High resolution optical images of fabricated arrays using the high precision leveling procedure.

FIG. 10 provide a higher resolution optical image of arrays consistent of 4 column and 12 rows of dots, each three rows starting from top to bottom in the red boxed area consists of dots fabricated at different dwell times (10, 5, 1, 0.1 sec respectively). As shown these dots are homogeneous across the same rows and columns and between arrays. At the beginning of each array there is a single dot related to the first contact point. As seen in these optical images, there is no deformation, skewing, non-specific deposition, negative features, and all the arrays are well defined, straight, and sharp.

Figure 11:
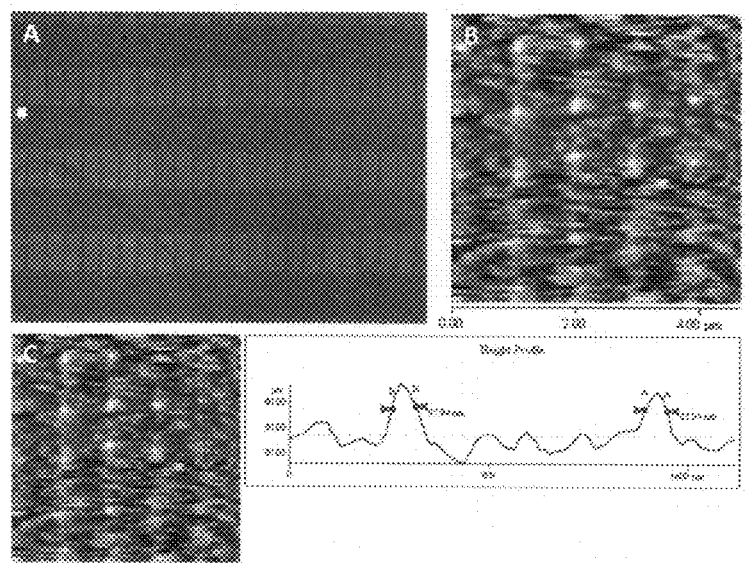
FIG. 11: High resolution optical and topographical AFM images of fabricated arrays.

Similarly to 1D probe array patterning, the pitch and size of dots can be controlled using the 2D PenArray. FIG. 11 provide an example of patterning results after the Alligator-Eyes leveling. The optical image in FIG. 11A (50×) shows rectangle arrays consisting of nanodots separated by 1 um, at this scale we could not resolve the features because the features are below the microscope resolution. FIGS. 11B and 11C represent a topographical AFM images and line profile of the fabricated dot arrays with an average dot diameter of 90 nm. This high-precision leveling technique provide a fast, accurate, and reproducible protocol to level 2D PenArrays with respect to a substrate and resulted in high quality, homogeneous patterning across large substrates.

Example 4

Controlling the Diffusion Rate of Thiol Molecules on Gold Substrate Using DPN Printing by Temperature Control Several problems need to be addressed for successful fabrication of thiolated molecule nanostructures on gold substrate using DPN and 2D PenArray for stem cell differentiation. Important parameters such as homogeneous spot diameter across a substrate, reproduction of spot diameter to less than 100 nm, reproducible protocol, control of thiolated molecule diffusion (slow down or speed up the diffusion), and minimize non-specific deposition are significantly important key issues that need to be addressed for obtaining homogenous stem cell differentiation. These problems can be addressed by using a heating and cooling stage that enables the heating up or cooling down the thiolated coated tips and the substrate system.

Figure 12:
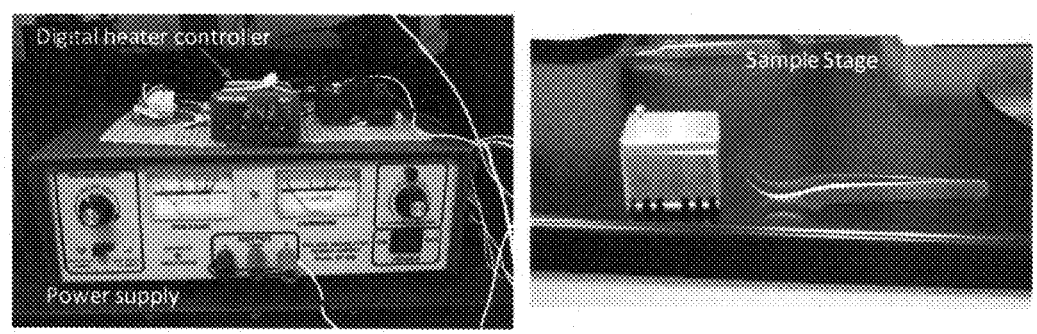
FIG. 12: A first generation cooling system which can be used for DPN fabrication.

First Generation:

In the past, one issue at times was the fast diffusion of many low melting point thiol molecules from the coated 2D PenArray, such as and not limited to ODT (loctadecane thiol), HDT (1-hexadecane thiol), and MUD (11-mercapto-1-undecanol). These molecules were diffusing fast at room temperature, which often lead to the fabrication of nanostructures larger than 100 nm using the minimum possible contact point between the coated tip and the gold substrate (dwell time of 0.01 sec). To circumvent this problem, we designed a cooling stage that cools the substrate. The cooling system is composed of a power supply, a solid block of aluminum as a stage with a Petlier module also called Thermoelectric cooler or heater, circuit board, and a digital heater controller. By applying a voltage in a pulsed fashion, the aluminum stage and substrate can be cooled down to less than 10° C. FIG. 12, shows the components of this design.

Figure 13:
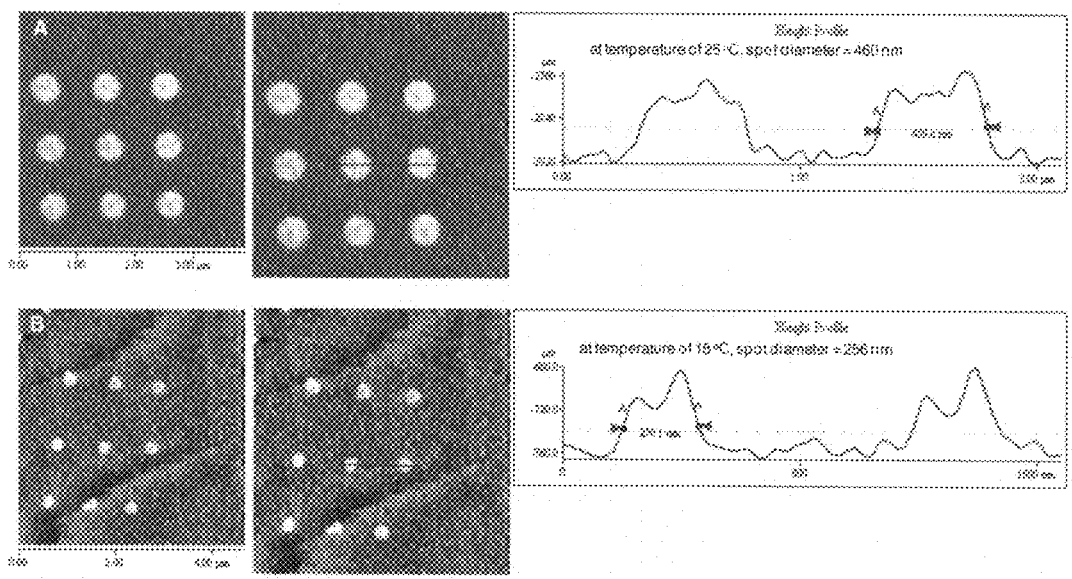
FIG. 13: Topographical and height profile of fabricated arrays at different temperatures. (A) at 25° C. and (B) at 18° C.

Although the first generation cooling system was able to decrease the dot diameter features of the generated patterns, it had some problems. Because stage cooling was not done in a continuous or in a variably controlled fashion, but rather in pulse mode, this introduces noise during pattern fabrication. Moreover, the temperature was not maintained below 16° c. for no longer than a few minutes which caused drifting during fabrication and imaging. Interestingly, at temperatures lower than ambient, at about 18° C., the diffusion rate of the thiol molecules from the tips to substrate surface was slower and the dots generated exhibit smaller diameter, as shown in FIG. 2. The topographical AFM (TAFM) images with a 5 second dwell times at 25° C. and 18° C., shows spot diameter of 460 and 256 nm, respectively. These arrays were fabricated on gold thin films using ODT coated tips, and the fabricated substrate was etched using gold etchant before AFM imaging. Furthermore, as seen in FIGS. 13A and 13B, the two arrays are distorted to the right in 13A and to the left in 13B, which is due to the cooling system's inability to maintain the desired temperature.

Figure 14:
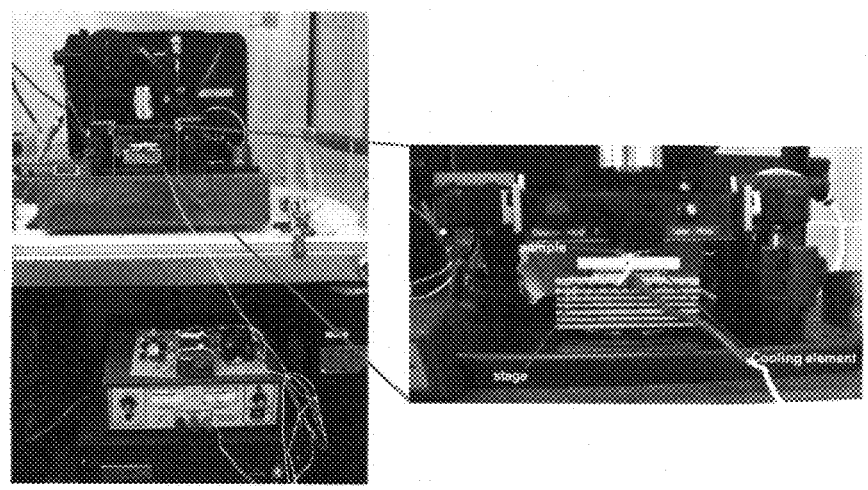
FIG. 14: A second generation cooling system.

Second Generation:

Owing to the inherent problems associated with the first generation cooling stage, a second generation was developed. Using a continuous current flow, it was a vast improvement over the first design because it was able to hold a constant temperature for a longer time, around 40 minutes. The newly designed stage was aluminum blocks stacked and spaced by 5 mm between each block, as shown in FIG. 14. Spacing in the blocks allows for air to enter and effect heat transfer.

Figure 15:
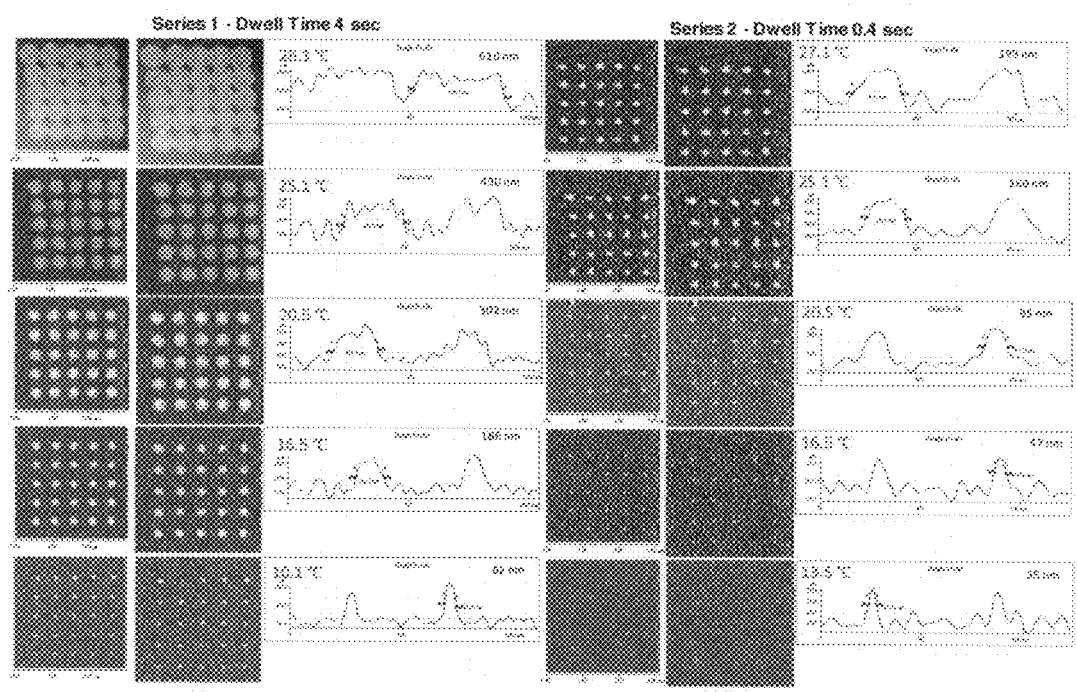
FIG. 15: Topographic AFM images and contour plots of 16-mercaptohexadecane thiol dots generated with various substrate temperatures.
Figure 16:
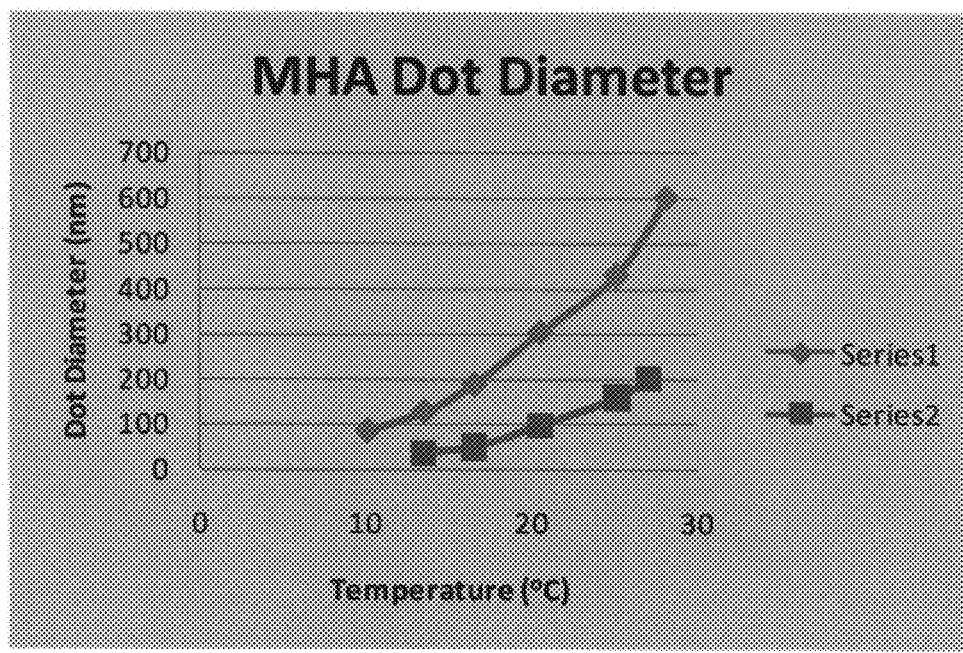
FIG. 16: Dot diameter and temperature plots for 16-mercaptohexadecane thiol with two different dwell times of 4 and 0.4 seconds (series 1 and 2, respectively).
Figure 17:
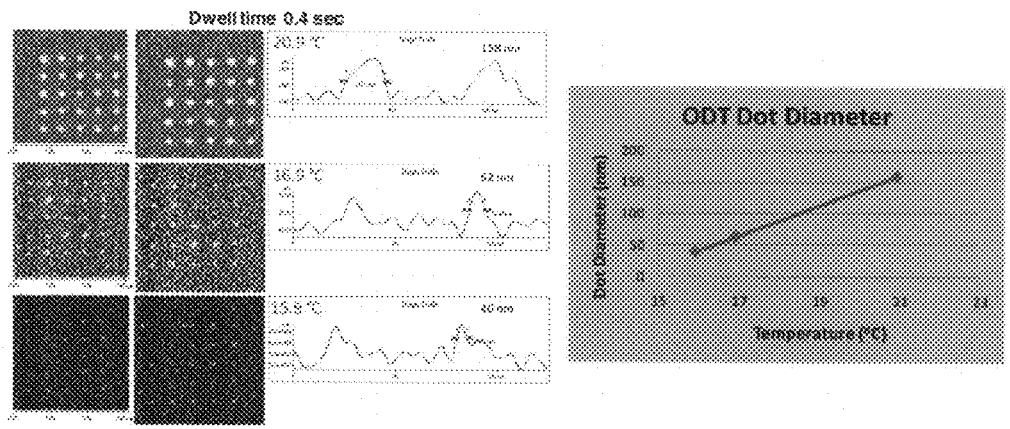
FIG. 17: Topographical AFM images and dot diameter contour plot vs temperature of 1-Octadecane thiol at a dwell time of 0.4 seconds.

Similar to the results of first generation cooling stage, the new design was able to cool down the system and decrease the generated dot diameters. Topographic AFM images and contour plots show that a decrease in dot diameter features are observed with decreasing temperature, FIG. 15. Using a 4 sec dwell time, a dot diameter was reduced from 610 nm at fabricated at 28° C. to 82 nm at 10° C. which can be routinely fabricated. Achieving this size was difficult using the first generation cooling system. Moreover, using a faster dwell time (0.4 sec), the diameter features can be further decreased to 35 nm routinely. Interestingly, an almost linear relationship can be seen observed for both dwell times and temperature, FIG. 16. ($R^2$ for MHA at two different OT of 4 and 0.4 sec are 0.948 and 0.971, respectively).

In order to confirm if the effect of temperature on the generated dot diameter features is applicable to other thiolated molecules, 1-octadecanethiol was used as an ink and writing temperatures were varied similar to that of 16-mercaptohexadecanethiol. A decrease in dot diameter features from 158 nm to 40 nm was observed for writing temperatures of 20.9° c. and 16° C. A plot of dot diameter features vs. temperature yielded an $R^2$ value of 0.9998.

Figure 18:
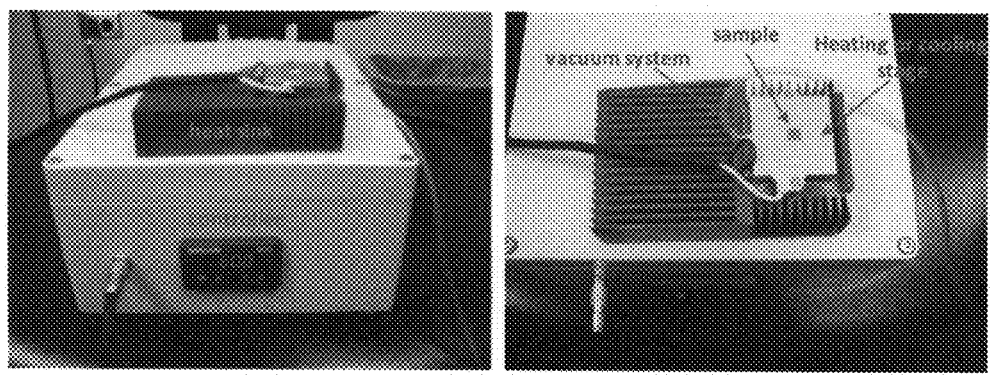
FIG. 18: Third generation of heating and cooling stage based on a Peltier module incorporated with a better material and design for a heat sink, which keeps the temperature constant for at least tens of hour without substantial thermal fluctuation.

Third Generation:

When patterning large areas ranging from 1 mm2 and up, the use of smallest dwell time is necessary for two reason, first to speed up the edge-to-edge writing time for highest throughput and also to avoid non-specific deposition for the length of fabrication time, which is desirably to be below 2 hours, the maximum writing time was achieved using the second generation without thermal drift was 40 minutes, which is not enough to fabricate high density arrays of 280 nm or less pitch between dots, for this reason a third generation was engineered as a cooling and heating stage which keep the temperature constant for tens of hours without any drifting due to the new stage design and material. FIG. 18 shows the heating and cooling system. Copper was used for heat dissipation, and the heat sink has many fins and high surface area. The vacuum system holds the substrate.

Figure 19:
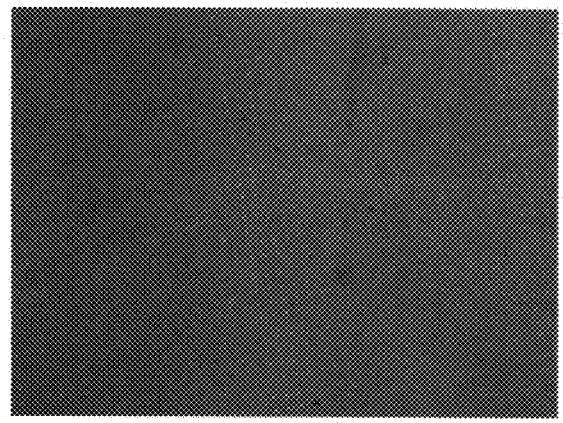
FIG. 19: Optical image of arrays fabricated using the third generation of heating and cooling stage.

An example is shown in FIG. 19 of arrays of dots with different dwell time were fabricated using OOT coated 2D Pen arrays and the new cooling system.

Figure 20:
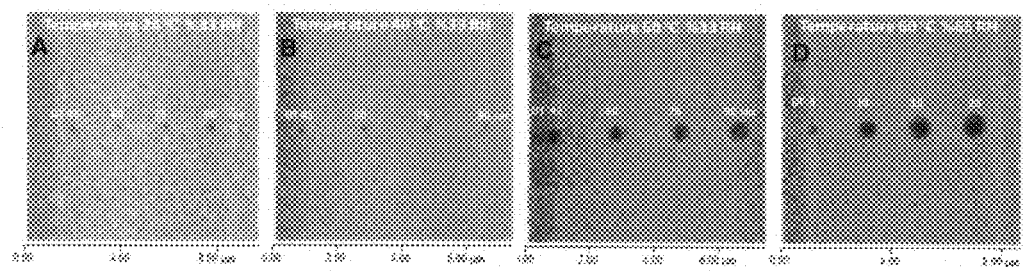
FIG. 20: Frictional AFM images of AUT nanodots generated at different temperatures and humidity.

Because higher melting point thiol molecules do not diffuse from the tips to the substrate surface as easily as the lower melting point thiol molecules, a different set up is needed to increase the diffusion rate using the smallest dwell time possible. As an example a thiol molecule with an amine functional group (1-Aminoundecane thiol (AUT)) was used to test if by increasing temperature the diffusion rate will increase. FIG. 20 shows frictional AFM images of AUT nanostructures fabricated using a single tip using various dwell times at different temperatures. As seen in these images, increasing temperatures results to an increase of generated spot diameter. In addition, spot diameter increased with increasing humidity as shown in FIGS. 20C and D.

Figure 21:
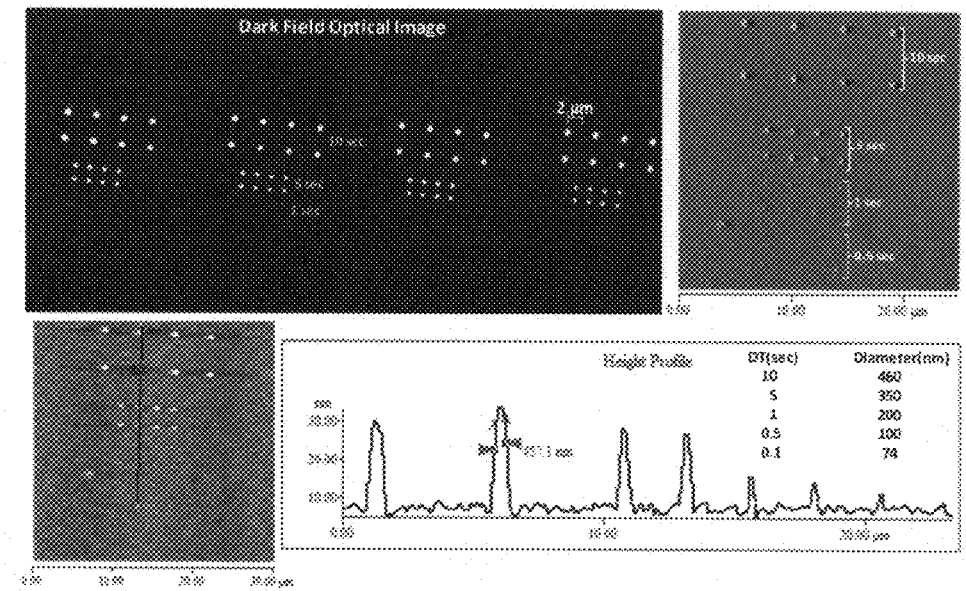
FIG. 21: Arrays fabricated using 1D tip array and heating stage at 60° C. and 65% RH.

To test the array homogeneity of the generated spots within the same array and from tip to tip, we used a 10 pen array consisting of 52 tips coated with AUT using vapor-coating under vacuum. As shown in FIG. 21, the optical dark field microscopy and AFM frictional images exhibit no changes in spot diameter within the same array and between arrays using the same dwell time. These arrays were fabricated at 60° C. and 65% relative humidity. Moreover, decreasing dwell times results to a decrease from 460 nm to 74 nm for 10 to 0.1 second, respectively. The cursor profile shows the decrease in dot diameter.

Figure 22:
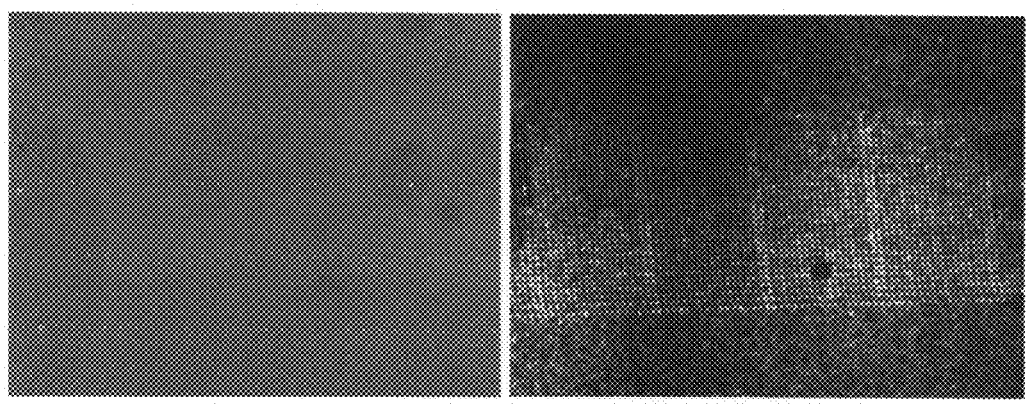
FIG. 22: Edge-to-edge generation of homogeneous array patterns using AUT coated 2D Pen Array Arrays using the Third generation stage system in the heating mode.

For higher throughput 2D PenArray was vapor-coated under vacuum with AUT. Edge-to-edge homogeneous arrays were generated on 5 mm$^2$ substrate at 60° C., as shown in FIG. 22. To better control the deposition and eliminate the first contact point during leveling or before pattern executions, the stage was operated at a low temperature to slow down the diffusion of the desired thiol dramatically, which will enable us to level and approach without any deposition or minimal deposition before patterning, and initial approach dots may be eliminated. In some cases where the stage expands or shrinks owing to the thermal changes that can lead to a difference in the original z-height (the contact between tips and surface) due to the expansion of the metal. This change can be compensated by increasing or decreasing the voltage exerted on the z-piezo for the designed patterns.

Example 5

The effect of homogenous surface on mesenchymal stem cell response Dip pen nanolithography was used to produce homogenous nanopattern of 5 mm$^2$ using thiolated ink with methyl group (ODT) deposited at the nanometer scale on a gold surface with 2D NanoPrint array. Nanopattern comprised a series of parallel dots spaced by a fixed distance (pitch, dα) of 280 nm and fixed diameter (dβ about 65-70 nm). Cell obtained from Lonza were passed through 4 passages and were cultured in contact with the ODT substrate at a concentration of 50,000 cell per well with 1 mL of basal media (Lonza, mesenchymal cell growth media) in a 24 well plate.

Figure 23:
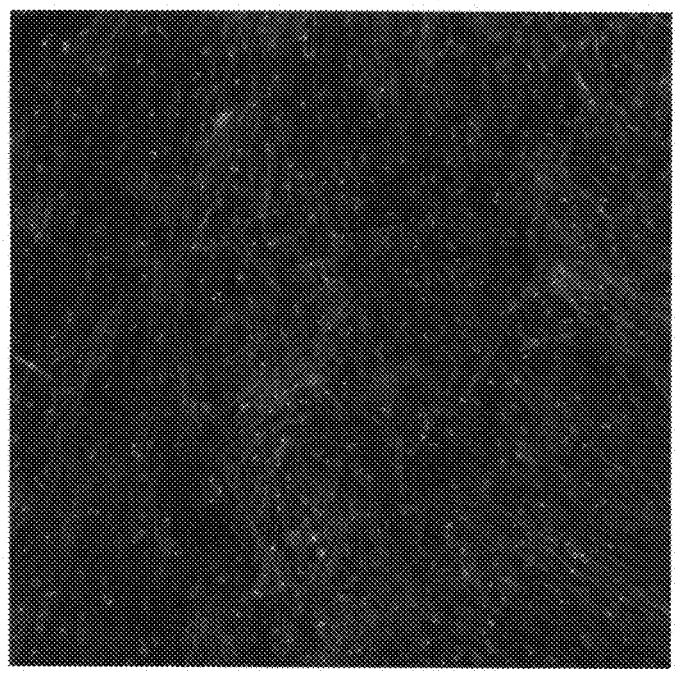
Figure 24:
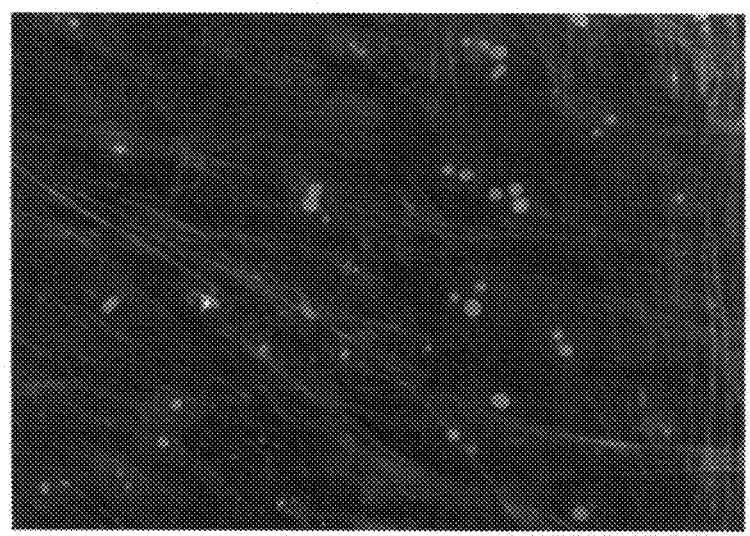
FIG. 24—ODT substrate stained with DAPI (blue), nucleostamin (green), actin (red) and STRO-1 (purple).

Samples were stained for mesenchymal stem cell marker, STRO-1 and nucleostemin, nucleus (DAPI), and actin fiber. The samples were placed onto ODT substrates and mounted with a florescence stabilizing mounting medium, Vectashield. The samples were analyzed by Zeiss model Axio imager microscope. See FIGS. 23 and 24.

TissueGnostic™ analysis showed that each cell expressed both mesenchymal stem cell markers, STRO-1 and nucleostamin. These results indicate, based on cell morphology and expression of mesenchymal stem cell markers, the response was homogenous across the ODT substrates.

What is claimed is:

1. A method comprising:
   providing an array of cantilevers, each cantilever comprising a tip thereon, and each cantilever being configured such that at least one visible red bright spot appears near the tip of the cantilever when ambient light is illuminated onto the cantilever;
   providing a substrate;
   viewing a cantilever in a first location on the array while moving the array and/or the substrate closer with respect to each other;
   determining a distance traveled by the array and/or the substrate before a red bright spot on a cantilever in the first location visibly dims, thereby determining when the tip of the cantilever in the first location contacts the substrate; and
   leveling the array and the substrate with respect to each other based at least in part on the distance traveled by the array and/or the substrate before the red bright spot on the cantilever in the first location visibly dims.

2. The method of claim 1, wherein each cantilever is configured such that at least two visible red bright spots appear near the tip of the cantilever when ambient light is illuminated onto the cantilever.

3. The method of claim 1, further comprising:
   viewing a cantilever in a second location on the array while moving the array and/or the substrate closer with respect to each other; and
   determining a distance traveled by the array and/or the substrate before a red bright spot on a cantilever in the second location visibly dims, thereby determining when the tip of the cantilever in the second location contacts the substrate,
   wherein the array and the substrate are leveled with respect to each other based at least in part on both (i) the distance traveled by the array and/or the substrate before the red bright spot on the cantilever in the first location visibly dims, and (ii) the distance traveled by the array and/or the substrate before the red bright spot on the cantilever in the second location visibly dims.

4. The method of claim 1, wherein the cantilevers are AFM cantilevers and the tips are AFM tips.

5. The method of claim 3, further comprising:
   viewing a cantilever in a third location on the array while moving the array and/or the substrate closer with respect to each other; and
   determining a distance traveled by the array and/or the substrate before a red bright spot on a cantilever in the third location visibly dims, thereby determining when the tip of the cantilever in the third location contacts the substrate,
   wherein the array and the substrate are leveled with respect to each other based at least in part on (i) the distance traveled by the array and/or the substrate before the red bright spot on the cantilever in the first location visibly dims, (ii) the distance traveled by the array and/or the substrate before the red bright spot on the cantilever in the second location visibly dims; and (iii) the distance traveled by the array and/or the substrate before the red bright spot on the cantilever in the third location visibly dims.

6. The method of claim 1, wherein a change in a brightness of the at least one red bright spot represents about one micron to about ten microns of movement toward the substrate.

7. The method of claim 1, wherein a change in a brightness of the at least one red bright spot represents about three microns to about five microns of movement toward the substrate.

8. The method of claim 1, wherein the leveling is carried out by steps comprising a macroscopic leveling step and a microscopic leveling step.

9. The method of claim 1, wherein the array is a two-dimensional array which comprises at least one viewport configured to allow the viewing of the cantilever at the first location.

10. The method of claim 1, wherein the array is two-dimensional array which comprises at least six viewports configured to allow the viewing of the cantilever at a plurality of locations on the array.

11. A method comprising:
    providing an array of cantilevers, each cantilever comprising a tip thereon, and each cantilever being configured such that at least one visible bright spot appears near the tip of the cantilever when ambient light is illuminated onto the cantilever;
    providing a substrate,
    moving the array and/or substrate closer with respect to each other; and
    determining that a contact between one of the tips and the substrate occurs when a bright spot on one of the cantilevers visibly dims.

12. A method comprising:
    providing an array of cantilevers, each cantilever comprising a tip thereon, and each cantilever being configured such that at least one marker appears near the tip of the cantilever when ambient light is illuminated onto the cantilever;
    providing a substrate;
    viewing a cantilever in a first location on the array while moving the array and/or the substrate closer with respect to each other;
    determining a distance traveled by the array and/or the substrate before a marker on a cantilever in the first location visibly dims, thereby determining when the tip of the cantilever in the first location contacts the substrate; and
    leveling the array and the substrate with respect to each other based at least in part on the distance traveled by the array and/or the substrate before the marker on the cantilever in the first location visibly dims.

13. The method of claim 12, wherein the cantilevers are silicon, polycrystalline silicon, silicon nitride, or silicon rich nitride cantilevers.

14. The method of claim 12, wherein the cantilevers are silicon nitride or silicon rich nitride cantilevers.

15. The method of claim 12, wherein the cantilevers are silicon nitride cantilevers.

16. The method of claim 12, wherein the cantilevers are silicon rich nitride cantilevers.

17. The method of claim 12, wherein the length of the cantilevers is about 10 microns to about 80 microns.

18. The method of claim 12, wherein the length of the cantilevers is about 25 microns to about 65 microns.

19. The method of claim 12, wherein the width of the cantilevers is about 5 microns to about 25 microns.

20. The method of claim 12, wherein the width of the cantilevers is about 10 microns to about 20 microns.

21. The method of claim 12, wherein the thickness of the cantilevers is about 100 nm to about 700 nm.

22. The method of claim 12, wherein the thickness of the cantilevers is about 250 nm to about 550 nm.

23. The method of claim 1, further comprising, after the leveling step, depositing a material from the tips of the cantilevers to the substrate.

24. The method of claim 12, further comprising, after the leveling step, depositing a material from the tips of the cantilevers to the substrate.

* * * * *